(12) United States Patent
Stahr et al.

(10) Patent No.: US 10,219,384 B2
(45) Date of Patent: Feb. 26, 2019

(54) CIRCUIT BOARD STRUCTURE

(71) Applicant: AT&S Austria Technologie & Systemtechnik Aktiengesellschaft, Leoben (AT)

(72) Inventors: Johannes Stahr, St. Lorenzen (AT); Mike Morianz, Graz (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 117 days.

(21) Appl. No.: 15/039,372

(22) PCT Filed: Oct. 9, 2014

(86) PCT No.: PCT/AT2014/050239
§ 371 (c)(1),
(2) Date: May 25, 2016

(87) PCT Pub. No.: WO2015/077808
PCT Pub. Date: Jun. 4, 2015

(65) Prior Publication Data
US 2017/0164481 A1    Jun. 8, 2017

(30) Foreign Application Priority Data
Nov. 27, 2013  (AT) ..................... 907/2013

(51) Int. Cl.
*H05K 1/00* (2006.01)
*H05K 1/18* (2006.01)
(Continued)

(52) U.S. Cl.
CPC ........ *H05K 1/185* (2013.01); *H01L 23/5389* (2013.01); *H01L 24/24* (2013.01);
(Continued)

(58) Field of Classification Search
CPC ...... H05K 1/0298; H05K 1/185; H05K 1/189; H05K 3/26; H05K 3/46
See application file for complete search history.

(56) References Cited

U.S. PATENT DOCUMENTS 4,931,134 A    6/1990  Jacques et al.
5,206,188 A    4/1993  Hiroi et al.
(Continued)

FOREIGN PATENT DOCUMENTS

AT    13434 U1       12/2013
CN    100525591 C    8/2009
(Continued)

OTHER PUBLICATIONS

International Search Report and Written Opinion for International Application No. PCT/AT2014/050239, Search completed Feb. 2, 2015, dated Feb. 9, 2015, 8 Pgs.
(Continued)

*Primary Examiner* — Yuriy Semenenko
(74) *Attorney, Agent, or Firm* — KPPB LLP

(57) ABSTRACT

A printed circuit board structure that includes at least one insulation layer, at least one conductor layer, and at least one embedded component having a contact pad that has an outer barrier layer, in which structure at least two conductor paths/conductor layers are connected to at least two connections using vias, and each via runs from a conductor path/conductor layer directly to the barrier contact layer of the corresponding connection of the component.

9 Claims, 5 Drawing Sheets

(51) Int. Cl.

| | | |
|---|---|---|
| *H05K 7/00* | (2006.01) | |
| *H01L 23/538* | (2006.01) | |
| *H01L 23/00* | (2006.01) | |
| *H05K 1/02* | (2006.01) | |
| *H05K 3/26* | (2006.01) | |
| *H05K 3/46* | (2006.01) | |
| *H05K 1/11* | (2006.01) | |
| *H05K 3/00* | (2006.01) | |
| *H05K 3/10* | (2006.01) | |

(52) U.S. Cl.
CPC ............ *H01L 24/25* (2013.01); *H01L 24/82* (2013.01); *H01L 24/96* (2013.01); *H05K 1/0298* (2013.01); *H05K 1/189* (2013.01); *H05K 3/0055* (2013.01); *H05K 3/26* (2013.01); *H05K 3/46* (2013.01); *H01L 23/5384* (2013.01); *H01L 2224/04105* (2013.01); *H01L 2224/05647* (2013.01); *H01L 2224/244* (2013.01); *H01L 2224/24137* (2013.01); *H01L 2224/24195* (2013.01); *H01L 2224/2518* (2013.01); *H01L 2224/8201* (2013.01); *H01L 2224/82039* (2013.01); *H01L 2224/82359* (2013.01); *H01L 2224/82379* (2013.01); *H01L 2924/1203* (2013.01); *H01L 2924/13055* (2013.01); *H01L 2924/13091* (2013.01); *H05K 1/115* (2013.01); *H05K 3/0035* (2013.01); *H05K 3/0038* (2013.01); *H05K 3/108* (2013.01); *H05K 2201/09509* (2013.01); *H05K 2201/10166* (2013.01); *H05K 2201/10174* (2013.01); *H05K 2203/0392* (2013.01); *H05K 2203/125* (2013.01)

(56) References Cited

U.S. PATENT DOCUMENTS

| | | |
|---|---|---|
| 5,241,456 A | 8/1993 | Marcinkiewicz et al. |
| 5,645,673 A | 7/1997 | Fasano et al. |
| 5,730,635 A | 3/1998 | De et al. |
| 6,005,289 A | 12/1999 | Watanabe |
| 6,120,693 A | 9/2000 | Petti et al. |
| 6,309,912 B1 | 10/2001 | Chiou et al. |
| 6,324,067 B1 | 11/2001 | Nishiyama |
| 6,442,033 B1 | 8/2002 | Lu et al. |
| 6,492,726 B1 | 12/2002 | Ang |
| 6,674,159 B1 | 1/2004 | Peterson |
| 6,687,985 B2 | 2/2004 | Nishiyama |
| 6,732,428 B1 | 5/2004 | Kwong |
| 6,815,046 B2 | 11/2004 | Kumano |
| 7,154,760 B2 | 12/2006 | Tsuchiya |
| 7,863,735 B1 | 1/2011 | Cho et al. |
| 7,894,203 B2 | 2/2011 | Tsuda |
| 7,977,579 B2 | 7/2011 | Bathan |
| 8,354,743 B2 | 1/2013 | Jensen |
| 8,381,394 B2 | 2/2013 | Shizuno |
| 8,400,776 B2 | 3/2013 | Sahara et al. |
| 8,563,358 B2 | 10/2013 | Landesberger et al. |
| 8,642,465 B2 | 2/2014 | Schimetta et al. |
| 8,789,271 B2 | 7/2014 | Zluc et al. |
| 8,914,974 B2 | 12/2014 | Lenhardt et al. |
| 9,418,930 B2 | 8/2016 | Johannes et al. |
| 9,648,758 B2 | 5/2017 | Gotzinger et al. |
| 9,713,248 B2 | 7/2017 | Langer et al. |
| 9,763,337 B2 | 9/2017 | Jager et al. |
| 9,781,845 B2 | 10/2017 | Stahr et al. |
| 9,820,381 B2 | 11/2017 | Wang et al. |
| 2002/0036100 A1 | 3/2002 | Slemmons et al. |
| 2003/0090883 A1 | 5/2003 | Asahi et al. |
| 2004/0114652 A1 | 6/2004 | Yoshikawa |
| 2004/0168825 A1 | 9/2004 | Sakamoto et al. |
| 2004/0170766 A1* | 9/2004 | Inoue ................. C23C 18/1619 427/355 |
| 2004/0233650 A1 | 11/2004 | Miyashita et al. |
| 2005/0103522 A1 | 5/2005 | Grundy et al. |
| 2005/0189640 A1 | 9/2005 | Grundy et al. |
| 2005/0190537 A1 | 9/2005 | Rossi et al. |
| 2005/0233122 A1 | 10/2005 | Nishimura et al. |
| 2006/0008970 A1 | 1/2006 | Oggioni et al. |
| 2006/0049530 A1 | 3/2006 | Hsu et al. |
| 2006/0101638 A1 | 5/2006 | Germann et al. |
| 2006/0120056 A1 | 6/2006 | Sasaki |
| 2006/0193108 A1 | 8/2006 | Usui et al. |
| 2006/0222285 A1 | 10/2006 | Minamio et al. |
| 2008/0067666 A1 | 3/2008 | Hsu |
| 2008/0192443 A1 | 8/2008 | Hatanaka et al. |
| 2008/0192450 A1 | 8/2008 | Tuominen et al. |
| 2008/0264687 A1 | 10/2008 | Park et al. |
| 2008/0283491 A1 | 11/2008 | Arai et al. |
| 2008/0296056 A1 | 12/2008 | Kinoshita et al. |
| 2009/0014749 A1 | 1/2009 | Matsuda et al. |
| 2009/0026168 A1 | 1/2009 | Tsai et al. |
| 2009/0194318 A1 | 8/2009 | Yeon et al. |
| 2009/0205859 A1 | 8/2009 | Tanaka et al. |
| 2009/0241333 A1 | 10/2009 | He et al. |
| 2009/0277673 A1 | 11/2009 | Sohn et al. |
| 2009/0293271 A1 | 12/2009 | Tanaka |
| 2010/0084175 A1 | 4/2010 | Suzuki et al. |
| 2010/0170703 A1 | 7/2010 | Iihola et al. |
| 2010/0252303 A1 | 10/2010 | Chang et al. |
| 2010/0282498 A1 | 11/2010 | Tezak et al. |
| 2011/0127076 A1 | 6/2011 | Jeong et al. |
| 2011/0127675 A1* | 6/2011 | Ewe ................. H01L 23/5389 257/773 |
| 2011/0183093 A1 | 7/2011 | Wada |
| 2011/0198018 A1 | 8/2011 | Schrittwieser et al. |
| 2011/0203836 A1 | 8/2011 | Yokota et al. |
| 2011/0212274 A1* | 9/2011 | Selsley ............... C23C 14/5826 427/540 |
| 2011/0259630 A1 | 10/2011 | Park |
| 2011/0272177 A1 | 11/2011 | Weichslberger et al. |
| 2011/0284267 A1 | 11/2011 | Chang |
| 2011/0290546 A1 | 12/2011 | Lee et al. |
| 2011/0304998 A1 | 12/2011 | Lin |
| 2011/0317381 A1 | 12/2011 | Kim et al. |
| 2012/0091594 A1 | 4/2012 | Landesberger et al. |
| 2012/0181074 A1 | 7/2012 | Ishihara et al. |
| 2012/0247819 A1 | 10/2012 | Tsuyutani et al. |
| 2013/0146991 A1* | 6/2013 | Otremba ............... H01L 25/071 257/401 |
| 2013/0153269 A1 | 6/2013 | Takahashi et al. |
| 2013/0256884 A1 | 10/2013 | Meyer |
| 2014/0000941 A1 | 1/2014 | Weidinger et al. |
| 2014/0254119 A1 | 9/2014 | Im |
| 2015/0007934 A1 | 1/2015 | Götzinger et al. |
| 2015/0157862 A1* | 6/2015 | Greenberg ........... A61B 5/6868 607/60 |
| 2015/0189763 A1 | 7/2015 | Schrittwieser |
| 2015/0334833 A1 | 11/2015 | Wang et al. |
| 2015/0334841 A1 | 11/2015 | Schmid et al. |
| 2015/0342062 A1 | 11/2015 | Jäger et al. |
| 2016/0021763 A1 | 1/2016 | Stahr et al. |
| 2016/0133558 A1 | 5/2016 | Stahr et al. |
| 2016/0324004 A1 | 11/2016 | Schwarz et al. |
| 2016/0353566 A1 | 12/2016 | langer et al. |
| 2017/0048984 A1 | 2/2017 | Weidinger et al. |

FOREIGN PATENT DOCUMENTS

| | | |
|---|---|---|
| CN | 102293070 A | 12/2011 |
| CN | 203072246 U | 7/2013 |
| DE | 19642488 A1 | 4/1998 |
| DE | 20021698 U1 | 4/2001 |
| DE | 20221189 U1 | 6/2005 |
| DE | 102006009723 A1 | 9/2007 |
| DE | 102008025223 A1 | 12/2008 |
| DE | 102008040906 A1 | 2/2010 |
| DE | 102010042567 B3 | 3/2012 |
| EP | 195935 A2 | 10/1986 |
| EP | 275433 A1 | 7/1988 |
| EP | 1225629 A2 | 7/2002 |

(56) References Cited

FOREIGN PATENT DOCUMENTS

| | | | |
|---|---|---|---|
| EP | 1304742 | A2 | 4/2003 |
| EP | 1424731 | A2 | 6/2004 |
| EP | 2119327 | B1 | 10/2011 |
| FR | 2822338 | A1 | 9/2002 |
| GB | 2485087 | A | 5/2012 |
| JP | 11150368 | A | 6/1999 |
| JP | 2003031914 | A | 1/2003 |
| JP | 2003198133 | A | 7/2003 |
| JP | 2004031682 | A | 1/2004 |
| JP | 2005333109 | A | 12/2005 |
| JP | 2007189006 | A | 7/2007 |
| JP | 2007318090 | A | 12/2007 |
| JP | 2010206124 | A | 9/2010 |
| JP | 2011138873 | A | 7/2011 |
| JP | 2012044102 | A | 3/2012 |
| JP | 2012151359 | A | 8/2012 |
| KR | 101253514 | B1 | 4/2013 |
| WO | 9820530 | A1 | 5/1998 |
| WO | 03092344 | A1 | 11/2003 |
| WO | 2005020651 | A1 | 3/2005 |
| WO | 2005104636 | A1 | 11/2005 |
| WO | 2006013230 | A2 | 2/2006 |
| WO | 2006134217 | A1 | 12/2006 |
| WO | 2007087660 | A1 | 8/2007 |
| WO | 2008098271 | A1 | 8/2008 |
| WO | 2008104324 | A1 | 9/2008 |
| WO | 2009143550 | A1 | 12/2009 |
| WO | 2010048654 | A1 | 5/2010 |
| WO | 2010085830 | A1 | 8/2010 |
| WO | 2011088489 | A1 | 7/2011 |
| WO | 2011099820 | A2 | 8/2011 |
| WO | 2012016258 | A2 | 2/2012 |
| WO | 2012065202 | A1 | 5/2012 |
| WO | 2012100274 | A1 | 8/2012 |
| WO | 2013029073 | A1 | 3/2013 |
| WO | 2013029074 | A1 | 3/2013 |
| WO | 2014131071 | A2 | 9/2014 |
| WO | 2014197917 | A1 | 12/2014 |
| WO | 2015077808 | A1 | 6/2015 |
| WO | 2015085342 | A1 | 6/2015 |
| WO | 2015113088 | | 8/2015 |
| WO | 2015127489 | | 9/2015 |

OTHER PUBLICATIONS

International Preliminary Report on Patentability for International Application No. PCT/AT2014/050239, Report dated Mar. 1, 2016, dated Jun. 1, 2016, 9 Pgs.
Austrian Search Report for Application No. A 740/2012, Filing Date Jul. 7, 2012, Search Completed May 3, 2013, 2 pgs.
International Preliminary Report on Patentability for International Application No. PCT/AT2013/000029, Report dated Aug. 26, 2014, dated Sep. 4, 2014, 13 Pgs.
International Preliminary Report on Patentability for International Application No. PCT/AT2013/050128, Report completed Sep. 16, 2014, 11 Pgs.
International Preliminary Report on Patentability for International Application No. PCT/AT2013/050249, Report dated Jun. 30, 2015, dated Jul. 9, 2015, 6 Pgs.
International Preliminary Report on Patentability for International Application No. PCT/AT2013/050260, Report dated Mar. 27, 2015, dated Mar. 27, 2015, 8 Pgs.
International Preliminary Report on Patentability for International Application No. PCT/AT2013/050262, Report dated Mar. 11, 2015, dated Mar. 11, 2015, 14 Pgs.
International Preliminary Report on Patentability for International Application PCT/AT2014/050044, Report Completed Jun. 23, 2015, dated Jun. 23, 2015, 18 Pgs.
International Preliminary Report on Patentability for International Application PCT/AT2014/050113, Report dated Aug. 28, 2015, dated Aug. 28, 2015, 8 Pgs.
International Preliminary Report on Patentability for International Application PCT/AT2014/050300, Report dated Oct. 10, 2015, dated Mar. 23, 2016, 9 Pgs.
International Preliminary Report on Patentability for International Application PCT/AT2015/050019, Report dated Aug. 2, 2016, dated Aug. 11, 2016, 8 Pgs.
International Preliminary Report on Patentability for International Application PCT/AT2015/050052, Report dated Jun. 6, 2016, dated Dec. 23, 2015, 16 Pgs.
International Search Report for International Application No. PCT/AT2014/050300, Search completed Mar. 13, 2015, dated Mar. 23, 2015, 3 Pgs.
International Search Report and Written Opinion for International Application No. PCT/AT2013/050262, Search completed Mar. 18, 2014, dated Mar. 27, 2014, 9 Pgs.
International Search Report and Written Opinion for International Application No. PCT/AT2014/050044, Search completed May 9, 2014, dated May 20, 2014, 9 Pgs.
International Search Report and Written Opinion for International Application No. PCT/AT2015/050019, Search completed Apr. 23, 2015, dated May 27, 2015, 9 Pgs.
International Search Report and Written Opinion for International Application No. PCT/AT2015/050052, Search completed May 26, 2015, dated Jun. 2, 2015, 10 Pgs.
International Search Report for International Application No. PCT/AT2013/050128, International Filing Date Jun. 25, 2013, Search Completed Oct. 23, 2013, dated Nov. 26, 2013, 6 pgs.
International Search Report for International Application No. PCT/AT2013/050249, Search completed Apr. 1, 2014, dated Sep. 4, 2014, 4 Pgs.
International Search Report for International Application No. PCT/AT2013/050260, Search completed Apr. 29, 2014, dated May 13, 2014, 4 Pgs.
International Search Report for International Application PCT/AT2013/000029, completed May 31, 2013, 6 pgs.
International Search Report for International Application PCT/AT2014/050113, Report completed Aug. 22, 2014, dated Aug. 28, 2014, 3 Pgs.
Written Opinion for International Application No. PCT/AT2013/050128, Search Completed Oct. 23, 2013, dated Nov. 26, 2013, 5 pgs.
Written Opinion for International Application No. PCT/AT2013/050249, Search completed Apr. 1, 2014, dated Sep. 4, 2014, 5 Pgs.
Written Opinion for International Application No. PCT/AT2013/050260, Search completed Apr. 29, 2014, dated May 13, 2014, 4 Pgs.
Written Opinion for International Application PCT/AT2014/050113, Report completed Aug. 22, 2014, dated Aug. 28, 2014, 6 Pgs.
Written Opinion for International Application PCT/AT2013/000029, completed May 31, 2013, 5 pgs.
Written Opinion for International Application No. PCT/AT2014/050300, Search completed Mar. 13, 2015, dated Mar. 23, 2015, 7 Pgs.
Charboneau, B C et al., "Double-Sided Liquid Cooling for Power Semiconductor Devices Using Embedded Power Packaging", IEEE Transactions on Industry Applications, IEEE Service Center, vol. 44, No. 5, Sep. 1, 2008, pp. 1645-1655, XP011446042, ISSN: 0093-994, DOI: 10.1109/TIA.2008.2002270.
Jian, Yin, "High Temperature SiC Embedded Chip Module (ECM) with Double-sided Metallization Structure", Jan. 2006, XP055135318, Gefunden im Internet: URL:http://hdl.handle.net/ 10919/30076.
Mital et al., "Thermal Design Methodology for an Embedded Power Electronic Module Using Double-Sided Microchannel Cooling", Journal of Electric Packaging, ASME International, US, vol. 130, No. 3, Sep. 1, 2008, XP008171354, DOI: 10.1115/1.2957320, Retrieved on Jul. 29, 2008.
Pang, Y et al., "Assessment of Some Integrated Cooling Mechanisms for an Active Integrated Power Electronics Module", Journal of Electronic Packaging, ASME International, US, vol. 129, No. 1,

(56) References Cited

OTHER PUBLICATIONS

Mar. 1, 2007, pp. 1-8, XP008171355, ISSN: 1 043-7398, DOI: 1 0.1115/1.2429703.

* cited by examiner

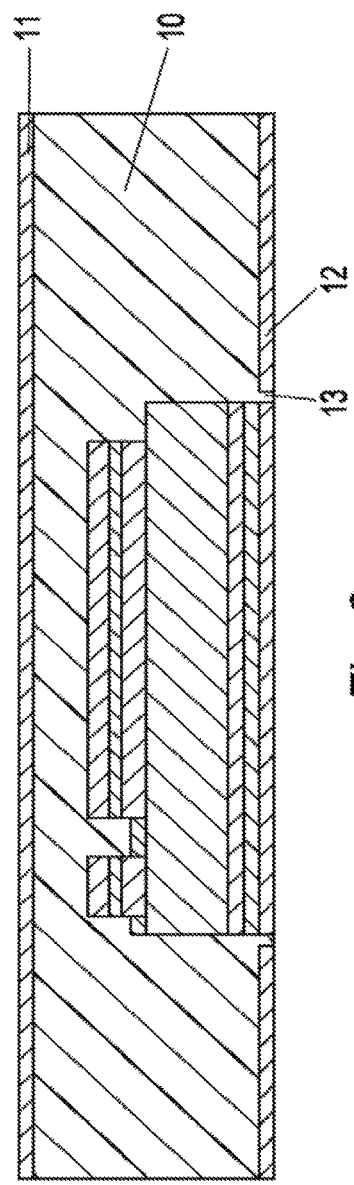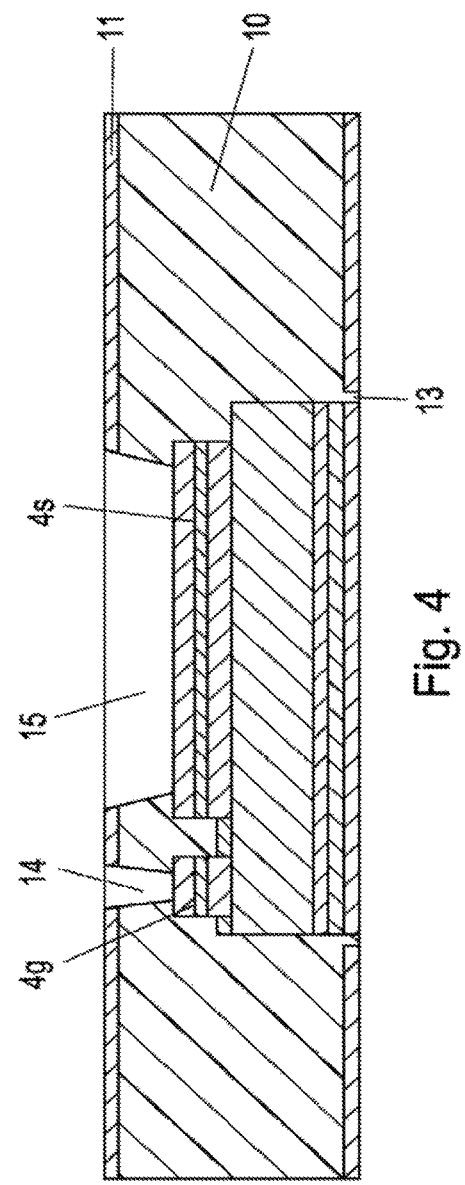

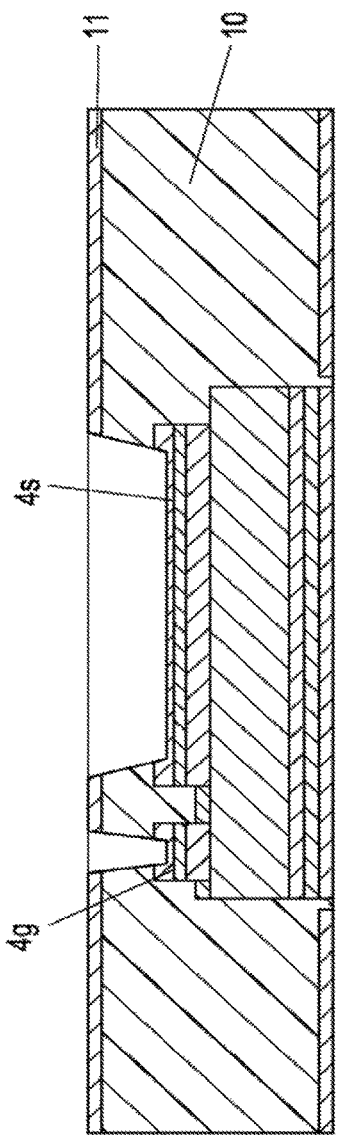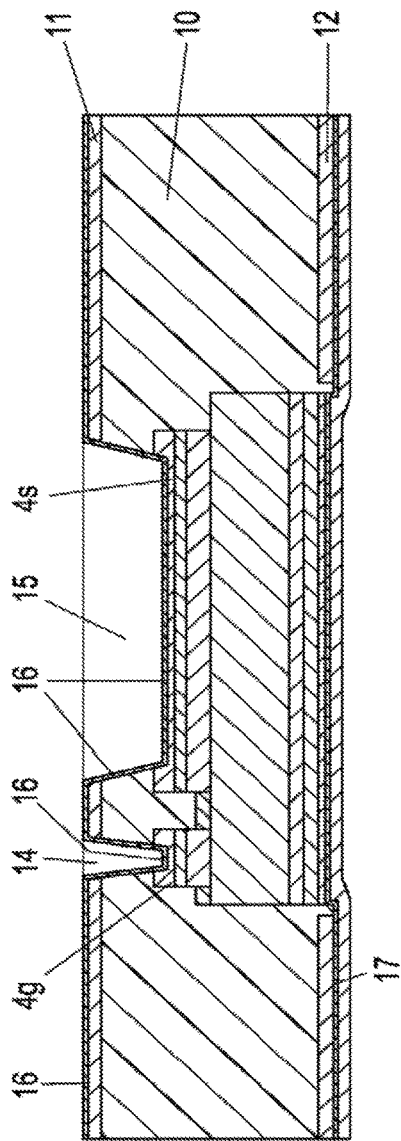

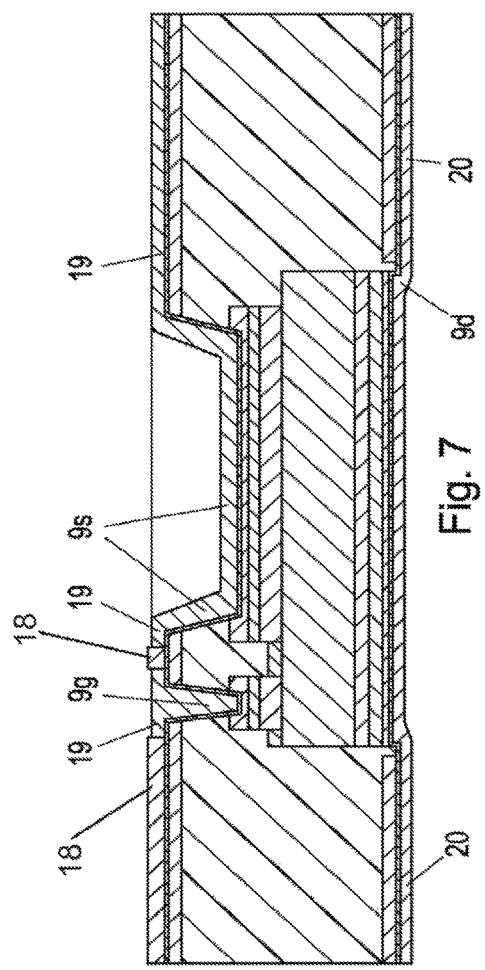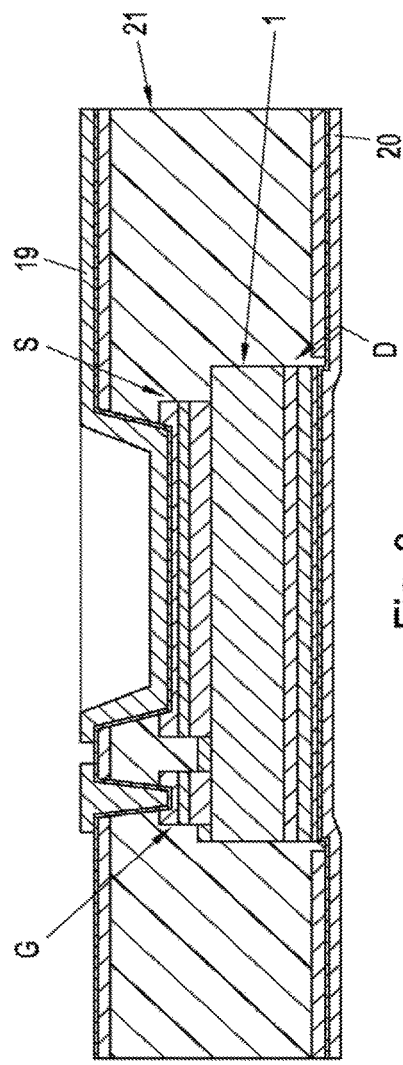

CIRCUIT BOARD STRUCTURE

RELATED APPLICATIONS

The current application is a national stage application No. PCT/AT2014/050239, filed Oct. 9, 2014, which application claims priority to Austrian Application No. A 907/2013, Filed Nov. 27, 2013, the disclosures of which are hereby incorporated by reference in their entireties.

FIELD OF THE INVENTION

The invention relates to a printed circuit board structure comprising at least one insulation layer, at least one conductor layer, and at least one embedded component having a contact pad that has an outer barrier layer, in which printed circuit board structure at least two conductor paths/conductor layers are connected to at least two connections using vias.

The invention furthermore relates to a method for contacting a component embedded in a printed circuit board structure to a conductor segment by producing vias from a conductor layer to connections of the component.

BACKGROUND OF THE INVENTION

According to the prior art, components are embedded in conductor structures and connected to conductors using copper vias. To this end, the contact pads of the components have copper connection pads that are built on a barrier layer, especially made of nickel. Such barrier layers are necessary to prevent copper from diffusing into adjacent layers, in the present case e.g. into an adhesion layer that comprises for instance titanium, titanium-tungsten, or chromium. In the case of semiconductors, such as e.g. a power MOSFET, disposed under the adhesion layer is a contact, made for instance of aluminum, for the drain or the gate of a MOSFET.

According to the prior art, metal connection pads, generally made of copper, are necessary at the connections of the components to permit proper connection of the connections to the conductors using copper vias. It is already possible to configure electronic and electronic components extremely thin, specifically on the order of magnitude of 20 μm, but due to such connection pads made of copper the thickness of the entire printed circuit board is relatively thick.

SUMMARY

One object of the invention is to create a printed circuit board structure or a method for producing such, wherein the production costs may be lowered, it is possible to use even extremely thin components, e.g. a thickness on the order of magnitude of 20 μm, and the use of copper connections to the components to be embedded is not necessary.

This object is attained with a printed circuit board of the type cited in the foregoing and in which in accordance with the invention each via runs from a conductor path/conductor layer directly to the barrier contact layer of the corresponding connection of the component.

Thanks to the invention, the result is simplified production of printed circuit board structures that may also be designed to be extremely thin.

In useful embodiments, the material of the barrier contact layer is selected from the group of nickel, nickel-vanadium, platinum, palladium, and cobalt.

It is furthermore advantageous when the material of the barrier contact layer is nickel.

Embodiments in which the via comprises copper are cost effective and technologically simple to accomplish.

In reliable variants it is provided that arranged below the barrier contact layer is an adhesion layer, wherein the adhesion layer is advantageously selected from the group of titanium, titanium-tungsten, and chromium.

The invention's advantages are especially apparent when the component is a power component, wherein this may be an IGBT chip/MOSFET, or a power diode.

The invention advantageously leads to variants in which the printed circuit board structure is flexible, at least in segments.

The object is also attained with a method of the type cited in the foregoing in which in accordance with the invention, in the area of the connections of the components, at least one opening is produced in an outer conductor layer, which opening extends to a barrier layer of a connection, and then at least one via from the conductor path/conductor layer directly to the barrier layer of the corresponding connection of the component is produced.

In one advantageous variant it is provided that, for forming a copper layer on the surface and in the openings, currentless copper-plating is performed on at least one side of the printed circuit board structure.

It is furthermore useful when the at least one opening is produced by laser cutting.

It is also to be recommended that at least one opening is cleaned chemically prior to the production of the vias.

During the chemical cleaning step, it is useful to reduce the thickness of the barrier layer.

In one advantageous variant of the method it is provided that, after the currentless copper-plating, a mask is applied to the at least one side of the printed circuit board structure and then electrolytic copper-plating is conducted for producing at least one conductor layer and then the vias are produced and the mask be removed.

BRIEF DESCRIPTION OF THE DRAWINGS

The invention and additional advantages are described in the following using exemplary embodiments that are illustrated in the drawings, wherein:

FIGS. 3 through 8 each depict, in sections through a printed circuit board structure, individual steps of an inventive method for embedding the component illustrated in FIG. 2;

DETAILED DESCRIPTION

Figure 1A:
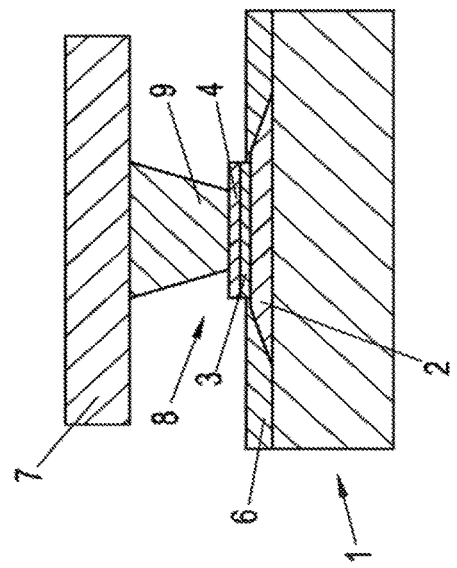
FIGS. 1a and 1b are significantly enlarged sectional detailed views of the contacting of a contact pad in a printed circuit board according to the prior art and the invention.
Figure 1B:
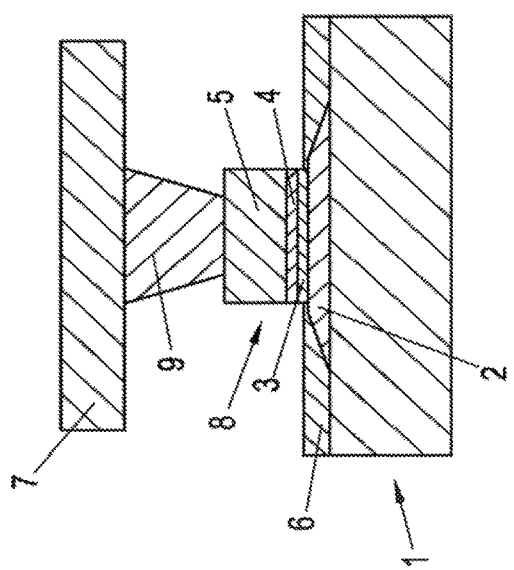

First FIGS. 1a and 1b shall be referenced; they will explain the principle difference between contacting a contact pad of an embedded component according to the prior art, on the one hand, and according to the invention, on the other hand.

FIG. 1a provides a detailed view of a component 1, for instance a chip, that has for contacting on its surface a flat contact 2, e.g. made of aluminum. Placed thereover is a contact adhesion layer 3, for instance made of titanium, titanium-tungsten, or chromium, and this is connected, with the interposition of a barrier layer 4, to a contact pad 5 that generally comprises copper. In addition, a passivation layer 6 that generally comprises silicon nitride is applied to the surface of the component 1.

Provided for connecting to a conductor 7 or conductor layer, generally comprising copper, within a printed circuit board structure not shown until further below, from the conductor 7 to the connection 8 of the component 1, comprising contact 2, adhesion layer 3, barrier layer 4, and contact pad 5, is a via 9 that, as shall also be explained in greater detail below, is produced electrolytically. The connection between the conductor 7 and the connection 8 of the component 1 is thus produced using a "two-stage" copper connection, specifically, the via 9 and the copper contact pad 5.

In contrast, FIG. 1b, in which the same reference numbers as in FIG. 1a are used for identical parts, illustrates that in accordance with the invention the via 9 runs from the conductor 7 directly to the barrier layer 4 of the contact pad of the connection 8.

Figure 2:
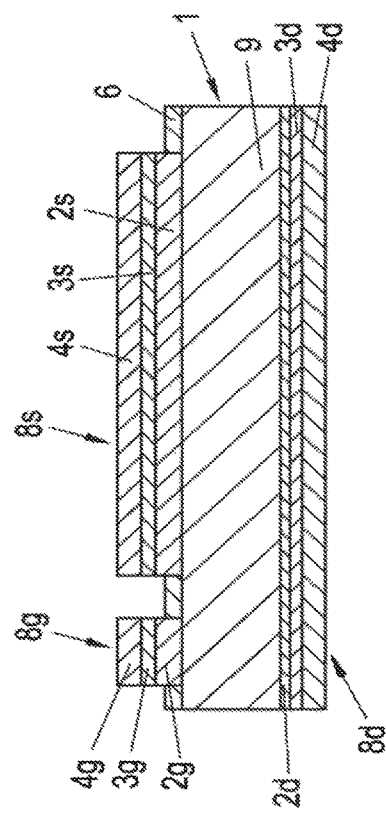
FIG. 2 is a sectional view of a power MOSFET, as an exemplary component, prior to embedding in a printed circuit board structure and prior to contacting.

In FIG. 2, depicted as an example of a component 1 is a power MOSFET that in accordance with the invention is to be embedded in a printed circuit board structure and is produced contacted on both sides using the planar process. The silicon substrate 1s, the structure of which is not shown in greater detail, has on its bottom for the drain connection 8d a flat drain contact 2d made of aluminum, followed by a drain adhesion layer 3 d made of titanium, and a drain barrier layer 4d made of nickel. Provided on the top side of the component 1 are, for the gate connection 8g, a flat gate contact 2g made of aluminum, thereabove a gate adhesion layer 3g, and, finally, a gate barrier layer 4g, and analogously the same for the source connection 8s having a flat source contact 2s made of aluminum, a source adhesion layer 3s, and a source barrier layer 4s. As has already been illustrated in FIG. 1, there is also a passivation layer 6 made of silicon nitride on the top side.

At this point it should be noted that terms such as "top", "bottom", "upper", "lower" and the like relate primarily to the drawings and are intended to simplify the description, but do not necessarily relate to any specific orientation of the described parts or their orientation in the production process.

The manufacture of an inventive printed circuit board structure is described in the following, referencing FIGS. 3 through 8, wherein in this case the embedding and contacting of the components according to FIG. 2 is illustrated using a segment of a printed circuit board component.

In a first step, in accordance with FIG. 3 the component 1 is embedded in a printed circuit board that in the present case comprises an insulation layer 10 having an upper conductor layer 11 and a lower conductor layer 12. The insulation layer 10 may be a conventional prepreg based on an epoxy resin with fiberglass reinforcement, e.g. FR 4 or, in other cases, e.g. a polyimide with or without reinforcement; the conductor layers are normally copper films. Embodied in the lower conductor layer 12 is a window 13 that exposes the bottom of the component and the drain connection 8d.

In the next step, as can be seen in FIG. 4, by etching off copper from the upper conductor layer and laser cutting the insulation layer 10, two openings are created on the top, specifically a gate opening 14 and a source opening 15, that reach to the gate barrier layer 4g and to the source barrier layer 4s of the gate connection 8g and source connection 8s.

In another step, the openings 14, 15 are cleaned with hole cleaning processes known in the field of printed circuit boards, e.g. by chemical cleaning using potassium permanganate, and the thickness of all barrier layers 4d, 4g, 4s may be reduced by chemical dissolution of the barrier layers. It is possible to see the reduced thickness of the barrier layers 4d, 4g, 4s in FIG. 5. Prior to the cleaning, the barrier layers 4d, 4g, 4s have a thickness of at least 100 nm or more and in the cleaning step are reduced by, for instance, 50 nm, and for thicker barrier layers by, for instance, up to 500 nm.

The result of a following step, in which currentless copper-plating is performed both on the top and on the bottom, is shown in FIG. 6. An upper copper layer 16 and a lower copper layer 17 are formed, wherein the upper copper layer 16 covers not only the upper conductor layer 11, but also the walls of the openings 14 and 15, as well as the gate barrier layer 4g and the source barrier layer 4s. The lower copper layer 17 likewise covers the lower conductor layer 12 and the one drain barrier layer 4d.

Although the description addresses copper layers, copper conductors, and the like, this shall in no way exclude the use of other suitable conductive materials, such as e.g. gold and silver.

With reference to FIG. 7, in the next step electrolytic copper-plating is performed on both the bottom and the top side, wherein those parts that are not to be copper-plated are covered with a mask 18 ("reverse mask") that is removed after the copper-plating. The result of this "semi-additive plating" are thick (compared to the copper layers 16, 17) outer conductor layers, specifically a structured upper conductor layer 19 and a lower conductor layer 20, wherein these conductor layers are integral with vias 9d, 9g, and 9s to the gate-, drain-, and source-contacts of the component 1. The total thickness of the outer conductor layers is, for instance, in the range of 5 to 70 μm. In the present case, because of the significant elongation of the drain contact, the via 9d to this contact is hardly recognizable as a "via;" instead, there is only a slight depression of the lower conductor layer by, e.g., less than 2 μm.

Once the mask 18 has been removed, the final result is the printed circuit board structure 21 that is illustrated in FIG. 8 and that includes the embedded component 1, which is electrically connected to the conductor layers 19, 20, or, more precisely, gate G, source S, and drain D and the associated connections 8g, 8s, and 8d of the MOSFET are connected to these correspondingly structured conductor layers 19, 20.

Figure 9:
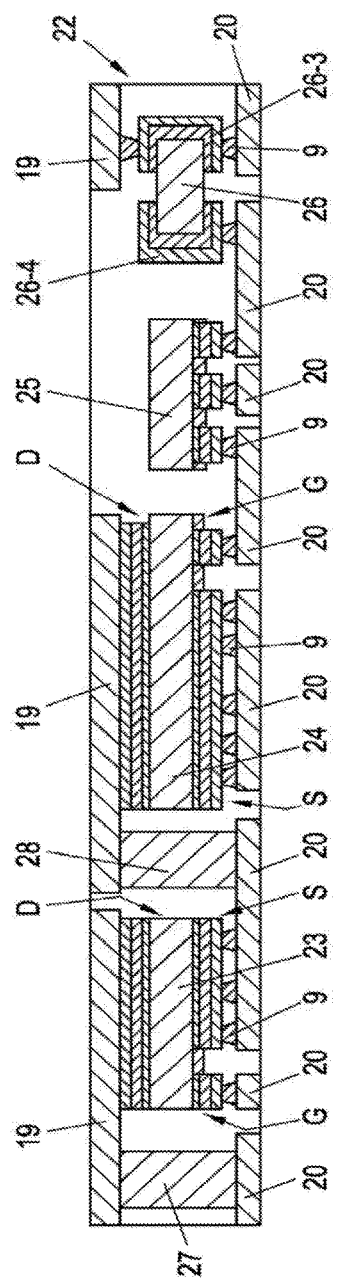
FIG. 9 depicts one variant of an inventive printed circuit board structure having a total of four embedded components; and, FIG. 9a depicts a segment from FIG. 9 having modified vias for two components.

FIG. 9 illustrates as an example another embodiment of a printed circuit board structure 22 that is manufactured according to the method described above and includes a total of four components, specifically a first MOSFET 23, e.g. a "high source FET", a second MOSFET 24, e.g. a "low source FET", a control chip 25, and a capacitor 26, e.g. a "multilayer cofired ceramic" capacitor. In FIG. 9, the same reference numbers are used for comparable parts as in the preceding figures, wherein it should also be noted that the MOSFET 23 and the MOSFET 24 are embedded in the printed circuit board structure 22 in the same manner and are connected to an upper and lower structured conductor layer 19 and 20, as illustrated previously in FIGS. 3 through 8, wherein however the gate and source connections are "below" and the drain connections are "above."

Also visible in FIG. 9 are two vias 27, 28 between the upper and the lower conductor layers 19, 20, wherein one via 28 produces a connection between source S of the first MOSFET 23 and drain D of the second MOSFET 24. In this embodiment, the vias are divided from the bottom conductor layer 20 to the drains of the MOSFETs into three or five vias 9. For the sake of simplicity, in FIG. 9 all of the vias from the conductor layers 19, 20 to component connections are provided with the reference number "9".

In FIG. 9, the control chip 25 is arranged to the right of the MOSFET 24 and the capacitor 26 is then arranged even further to the right.

The structure of the electrode contacting for the MOSFETs 23 and 24 and the control chip 25 is the same as illustrated in FIG. 1b and FIG. 2; thus, from the inside to the outside, it comprises a contact layer, a contact adhesion layer, and a barrier layer. In contrast, the two connections for the capacitor 26 are each provided on the inside with a contact adhesion layer 26-3, followed by a contact barrier layer 26-4. The adhesion layers 26-3 preferably comprise chromium and the barrier layers 26-4 nickel. The printed circuit board structure 22 illustrated in FIG. 9 may include additional components (not shown here), such as power diodes, resistors, and inductors.

Figure 9A:
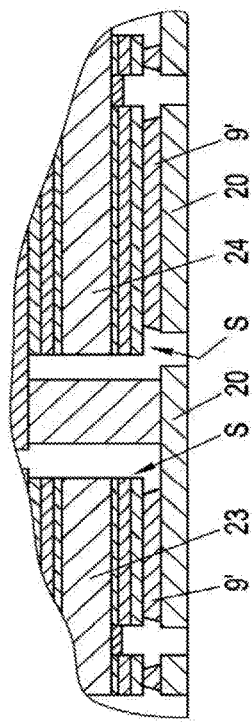

In one embodiment depicted in the segment in accordance with FIG. 9a, for increasing the ampacity, not only are the drain connections of the MOSFETs 23, 24 contacted across their entire surface, but also their source connections are contacted across their entire surface, i.e. instead of the three vias 9 for the source S of the MOSFET 23 and the five vias 9 for the source S of the MOSFET 24, there is only one large via designed which is labeled 9'.

Because the invention makes it possible to keep the thickness of the printed circuit board structure very thin, it is also easily possible for the printed circuit board structure to be designed to be very flexible, at least in segments, wherein in this case polyimide, for instance, may be used as the material for the insulation layer.

What is claimed is:

1. A printed circuit board structure comprising;
    at least one insulation layer, at least one conductor layer, and at least one embedded component, wherein the at least one embedded component further comprises at least two connections, each of the at least two connections comprising a contact, an adhesion layer, and an outer barrier layer disposed on an outer surface of the adhesion layer, wherein in an area of the at least two connections of the embedded component the at least one insulation layer has at least one opening which extends to the outer barrier layer of the at least two connections, and
    wherein the printed circuit board structure has at least two conductor paths that are connected to the at least two connections using vias which correspond to each of the at least two connections,
        and each via runs from a conductor path directly to the outer barrier layer of the corresponding connection of the component, wherein the material of the barrier layer is selected from the group of nickel, nickel-vanadium, platinum, and cobalt,
        characterized in that
        the at least one opening is cleaned chemically, whereby the thickness of the barrier layer in the area of the at least one opening is reduced.

2. The printed circuit board structure according to claim 1, characterized in that the material of the barrier contact layer is nickel.

3. The printed circuit board structure according to claim 1, characterized in that the via comprises copper.

4. The printed circuit board structure according to claim 1, characterized in that the adhesion layer is arranged below the barrier contact layer.

5. The printed circuit board structure according to claim 4, characterized in that the adhesion layer is selected from the group of titanium, titanium-tungsten, and chromium.

6. The printed circuit board structure according to claim 1, characterized in that the component is a power component.

7. The printed circuit board structure according to claim 6, characterized in that the power component is an IGBT-Chip/MOSFET.

8. The printed circuit board structure according to claim 7, characterized in that the component is a power diode.

9. The printed circuit board structure according to claim 1, characterized in that it is embodied to be flexible, at least flexible in segments.

* * * * *